(12) United States Patent
Mekonnen et al.

(10) Patent No.: US 11,742,293 B2
(45) Date of Patent: Aug. 29, 2023

(54) MULTIPLE DIE PACKAGE USING AN EMBEDDED BRIDGE CONNECTING DIES

(71) Applicant: Intel Corporation, Santa Clara, CA (US)

(72) Inventors: Yidnekachew S. Mekonnen, Chandler, AZ (US); Kemel Aygun, Chandler, AZ (US); Ravindranath V. Mahajan, Chandler, AZ (US); Christopher S. Baldwin, Chandler, AZ (US); Rajasekaran Swaminathan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 380 days.

(21) Appl. No.: 16/480,654

(22) PCT Filed: Mar. 22, 2017

(86) PCT No.: PCT/US2017/023575
§ 371 (c)(1),
(2) Date: Jul. 24, 2019

(87) PCT Pub. No.: WO2018/174869
PCT Pub. Date: Sep. 27, 2018

(65) Prior Publication Data
US 2019/0363049 A1 Nov. 28, 2019

(51) Int. Cl.
*H01L 23/538* (2006.01)
*H01L 21/48* (2006.01)
(Continued)

(52) U.S. Cl.
CPC ........ *H01L 23/5381* (2013.01); *H01L 21/486* (2013.01); *H01L 21/4853* (2013.01);
(Continued)

(58) Field of Classification Search
CPC .............. H01L 23/13; H01L 23/5384; H01L 2924/1431; H01L 2924/1434;
(Continued)

(56) References Cited

U.S. PATENT DOCUMENTS 8,064,224 B2   11/2011   Mahajan et al.
2010/0327424 A1*  12/2010   Braunisch ........... H01L 25/0655
                                                         257/692
(Continued)

FOREIGN PATENT DOCUMENTS

WO   WO-2015-130264   9/2015

OTHER PUBLICATIONS

International Preliminary Report on Patentability from International Patent Application No. PCT/US2017/023575, dated Oct. 3, 2019, 13 pgs.

(Continued)

*Primary Examiner* — Julio J Maldonado
*Assistant Examiner* — Stanetta D Isaac
(74) *Attorney, Agent, or Firm* — Schwabe, Williamson & Wyatt, P.C.

(57) ABSTRACT

A multiple die package is described that has an embedded bridge to connect the dies. One example is a microelectronic package that includes a package substrate, a silicon bridge embedded in the substrate, a first interconnect having a first plurality of contacts at a first location of the silicon bridge, a second interconnect having a second plurality of contacts at a second location of the silicon bridge, a third interconnect having a third plurality of contacts at a third location of the silicon bridge, and an electrically conductive line in the silicon bridge connecting a contact of the first interconnect, a contact of the second interconnect, and a contact of the third interconnect each to each other.

15 Claims, 8 Drawing Sheets

(51) Int. Cl.
*H01L 23/14* (2006.01)
*H01L 23/00* (2006.01)
*H01L 25/065* (2023.01)
*H01L 25/00* (2006.01)

(52) U.S. Cl.
CPC ........ *H01L 23/145* (2013.01); *H01L 23/5383* (2013.01); *H01L 23/5386* (2013.01); *H01L 24/16* (2013.01); *H01L 25/0655* (2013.01); *H01L 25/50* (2013.01); *H01L 2224/16227* (2013.01); *H01L 2224/16235* (2013.01)

(58) Field of Classification Search
CPC . H01L 2924/15192; H01L 2924/15313; H01L 24/14; H01L 2224/1403; H01L 25/18
See application file for complete search history.

(56) References Cited

U.S. PATENT DOCUMENTS

| 2011/0316572 | A1  | 12/2011 | Rahman |                |
|--------------|-----|---------|--------|----------------|
| 2015/0171015 | A1  | 6/2015  | Mahajan et al. | |
| 2016/0141234 | A1  | 5/2016  | We et al. | |
| 2016/0300796 | A1* | 10/2016 | Karhade | H01L 23/49827 |
| 2016/0343666 | A1* | 11/2016 | Deshpande | H01L 23/5383 |

OTHER PUBLICATIONS

International Search Report and Written Opinion for International Patent Application No. PCT/US2017/023575 dated Nov. 29, 2017, 16 pgs.

\* cited by examiner

MULTIPLE DIE PACKAGE USING AN EMBEDDED BRIDGE CONNECTING DIES

CROSS-REFERENCE TO RELATED APPLICATION

This patent application is a U.S. National Phase Application under 35 U.S.C. § 371 of International Application No. PCT/US2017/023575, filed Mar. 22, 2017, entitled "MULTIPLE DIE PACKAGE USING AN EMBEDDED BRIDGE CONNECTING DIES," which designates the United States of America, the entire disclosure of which is hereby incorporated by reference in its entirety and for all purposes.

FIELD

The disclosed embodiments of the invention relate generally to microelectronic packages, and more particularly to electrical connections within microelectronic packages.

BACKGROUND

As computing and communication devices are made smaller, more dies are packaged in a single package. In many cases a central processing unit (CPU) is packaged together with memory, graphics, or communications dies. The packaged dies are then mounted to a circuit board for connection to power and external interfaces. When more than one die is included in one package the combination may be referred to as a system in a package (SiP). These have the advantage of being smaller than multiple packages would be and of being easier to mount and connect to the circuit board than multiple packages would be.

Inside the package, the dies may be stacked, placed side-by-side, or combined in some other multi-chip-module (MCM) format. Side-by-side dies are mounted to a package substrate, an interposer, or a redistribution layer and connected through the package substrate to the circuit board. In some cases, for direct connections between the dies, the dies are connected through the package substrate, interposer, or redistribution layer without going through the circuit board. This allows for a faster, higher quality, and shorter connection which improves speed and reduces power.

For higher I/O (Input/Output) density, a special bridge is sometimes used to connect one die to another. The bridge is made from a higher quality material with denser interconnects to allow more and faster connections than are possible with a standard package substrate. In some cases, this is referred to as an embedded multi-die interconnect bridge (EMIB). The EMIB is placed under an outer edge of each of the two dies and bridges the gap between them. In this way the bridge can connect contacts on the edges of these two dies with a point-to-point signal connection topology between the two dies.

BRIEF DESCRIPTION OF THE DRAWINGS

Embodiments are illustrated by way of example, and not by way of limitation, in the figures of the accompanying drawings in which like reference numerals refer to similar elements.

DETAILED DESCRIPTION

Figure 1:
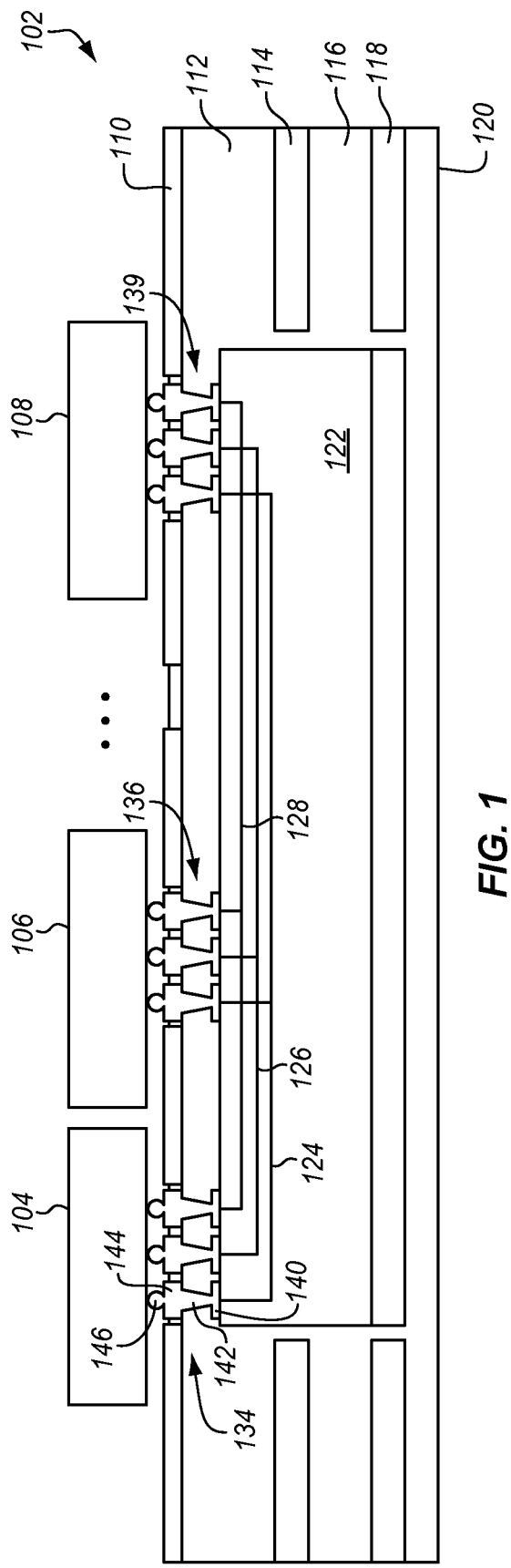
FIG. 1 is a cross-sectional side view diagram of a linear multi-drop topology using an embedded silicon bridge in a package substrate according to an embodiment.

In the present description, different embedded multi-die interconnect bridge (EMIB) connection topologies may be used to connect multiple dies to each other through a single EMIB. Such a connection topology is able to provide product design flexibility to improve product performance, to add product features or to reduce product cost. The capability of a single EMIB may be extended to connect multiple dies through different EMIB connection topologies. The additional EMIB connection topologies provide product design flexibility to improve product performance or to reduce product cost.

The described embedded multi-die interconnect bridge (EMIB) provides a dense multichip packaging solution for high density interconnects with a very high density of physical interconnects, also referred to as I/O's, per mm of die edge between two or more dies on an organic package substrate. EMIB provides localized high density wiring when the rest of the package substrate has organic package interconnects. The EMIB technology uses thin pieces of silicon embedded into the organic package with multi-layer BEOL (Back End of the Line) interconnects. The bridge may be embedded within the top few layers (e.g. one or two) of the organic package.

The hybrid structure of a bridge embedded in an organic package provides many of the advantages of both. A fully organic package substrate cannot support the I/O density and data speed that is preferred to connect two dies directly together. A fully silicon package substrate could allow for more and faster connections, but it would be expensive and prone to cracking with thermal cycling and mechanical stress. The current silicon bridge that connects an edge of a logic die, to an edge of a memory die, point-to-point, gives high performance at low cost. The logic die and the memory die can each be made separately in a process optimized for the intended circuit components. They are then connected directly through a high speed silicon link that is so small that it adds little cost and has little effect on the thermal and mechanical characteristics of the package substrate.

When there are more dies within the package, then the design of the bridge is more difficult. The balance between the shape, size, and placement of the silicon part and the organic part is made more complex. The structures described herein allow the resulting package to retain the advantages of both the silicon and the organic structures. In addition new connection topologies are enabled which support new types of packages including, multiple memory chips, and SiP.

The bridge may be applied to central processing units (CPUs), graphics processing units (GPUs), field programmable gate arrays (FPGAs), high-speed transceivers, and stacked dynamics random-access memory (DRAM), including high-bandwidth memory (HBM). Instead of a silicon interposer the described EMIB uses localized silicon bridges that are lower cost by avoiding through-silicon vias (TSVs) and by reducing the silicon area to die edges. The bridge may connect directly to flip chip pads on the die using vias through the top two layers of the package.

Currently EMIB connection topology is used as a point-to-point topology between two dies where each signal bump from one die is connected to the corresponding signal bump to another die. Described herein are new topologies that enable new kinds of connections. These new topologies allow for new use conditions for a single EMIB that can be extended extensively to connect multiple dies in different but specific manners. These connections use the benefits of the high density connection capabilities of EMIB. Multiple die connection topologies or schemes are described herein that extend the high-density interconnect capabilities of a single EMIB to new packaging and connection possibilities.

FIG. 1 is a diagram of a linear multi-drop topology using an embedded silicon bridge 122. In this connection topology, a signal bump from a first die 104 connects to its corresponding signal bump in a second die 106 and to a corresponding signal bump in the Nth die 108 through a single bridge. In such a connection topology, one of the dies may be a host or master and the other dies may be memory modules or slave dies. There may be three or more dies as shown.

More specifically, a package substrate 102 has a silicon bridge 122 embedded within it. The substrate has alternating layers of metal 110, 114, 118 and dielectric 112, 116, 120. The substrate may be made of any of a variety of organic multiple layer structures. The bridge is embedded below the top two layers 110, 112 of the substrate in a well. The well extends down to the fifth layer 118 of the substrate in this example, but the particular depth of the well may be adapted to suit the bridge material and structure and the structure of the substrate. The multiple layers of the substrate may be used for redistribution and to connect the dies 104, 106, 108 to external components through the substrate.

The bridge 122 has three interconnects 134, 136, 139, one for each die 104, 106, 108. The interconnects of the bridge are positioned so that they are aligned with connection bumps of the dies when the dies are attached to the substrate. The interconnects are shown as having three contacts as an example but there may be many more. Each of the three contacts of each interconnect is coupled through a respective electrically conducting line 124, 126, 128 through the silicon bridge 122 to each other interconnect. In other words, a first contact of the first interconnect 134 is coupled to a line 124 in the bridge that electrically connects to a contact of the second interconnect 136 and also connects to a contact of the third interconnect 139. In this way the first die is connected to each of the other dies with a multi-drop topology. In this example all of the contacts of the first interconnect connect in this way to corresponding contacts of the interconnects for all of the dies.

The contacts each have a pad 140 on the top of the bridge. After the bridge is placed in the well of the substrate and a dielectric is deposited over the bridge, a via 142 is formed for each of the contact pads 140. This is filled with conductor such as copper and a top pad 144 is formed over the via. A solder ball or other connector 146 is formed over the top pad to make the connection with a bump on the die. The particular type of connector may be adapted to suit any particular type of die. In some embodiments, the solder ball 146 is in the form of C4 (Controlled Collapse Chip Connection).

As shown, the bridge 122 does not extend all the way across the first 104 and last 108 die. Instead the bridge only extends partially under the first and last die. This allows the size of the bridge to be minimized to only what is necessary to support the interconnects 134, 139 on the first and last die. Reducing the size of the bridge, reduces cost, provides more area for the die to connect to the substrate 102 and preserves more of the thermal and mechanical characteristics of the organic substrate for the overall package. The bridge may be made still shorter so that it is under a narrower edge of the die depending on the bump configuration.

Figure 2:
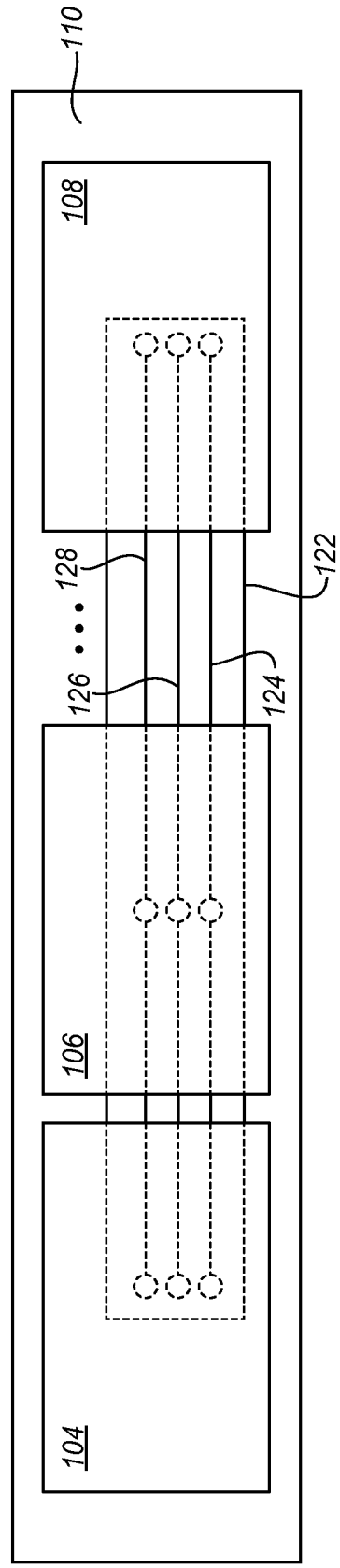
FIG. 2 is a top view diagram of the topology of FIG. 1.

FIG. 2 is a top partially transparent view diagram of the same structure of a linear multi-drop topology package as in FIG. 1. The three dies 104, 106, 108 are visible over the top layer 110 of the package. The bridge 122 is under a part of the first die 104 and the last die 108 in the row of dies. The bridge extends all the way across the one or more middle dies 106 in the direction from the first to the last die. In other words, for any dies in the middle of the row, the bridge extends all the way across under the die in one direction. Notice that the bridge is not as wide as the die, however. As a result, the bridge is under the die on two opposite side but not under the die on the other two opposite sides.

Bumps on these two sides of the die that are not over the bridge may be used to connect to the package substrate for redistribution, external connection and other purposes. In addition, the cost and impact of the structure of the bridge is reduced, the narrower the bridge is. The bridge may be made narrower as a percentage of the width of the die than is shown in the drawing figure. As shown, the bridge is narrower than the die 106 attached to the second interconnect 136 and shorter than the dies 104, 108 attached to the first and the last interconnect 134, 139 so that the area of the bridge under the first and second die is less than the area of the first and second die on the package substrate 102.

The interconnects 134, 136, 139 are shown as having three contacts but in an orthogonal orientation. Similarly the three lines are shown as side-by-side instead of one on top of the other as in FIG. 1. In an actual system there may be far more than three contacts laterally as in FIG. 1 and three contacts transversely in FIG. 1 and nine contacts if the array extends in both directions. There may also be more than three lines to connect the contacts. These three contacts are shown to illustrate the principles and a real system may have vertically stacked and laterally arranged lines as well as many different contacts connecting and arranged in different ways.

Figure 3:
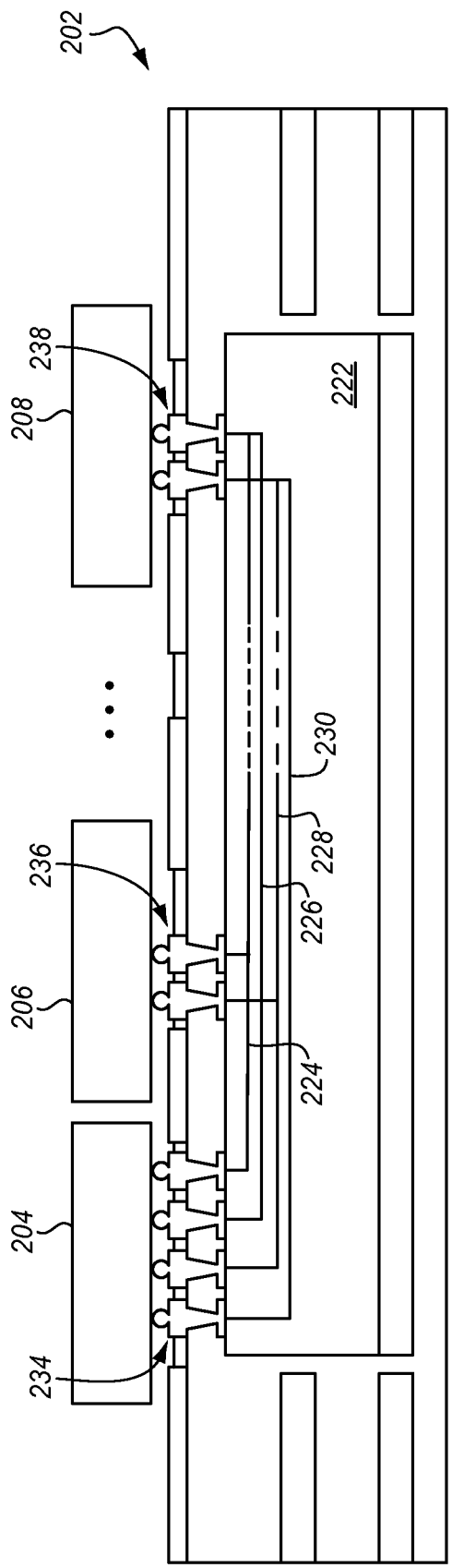
FIG. 3 is a cross-sectional side view diagram of a ring multi-drop topology using an embedded silicon bridge in a package substrate according to an embodiment.

FIG. 3 is a cross-sectional view similar to FIG. 1 to show a ring multi-drop topology with a bridge and multiple dies. In this example as in FIG. 1 a multi-layer substrate 202 carries three or more dies 204, 206, 208. The dies are connected electrically and physically to the substrate and they connect to external components as well as to each other through the substrate. An embedded bridge 222 within the substrate 202 connects the dies to each other with a higher quality, faster, lower error rate link than the connection through the substrate.

In this connection topology, a signal bump from the first die 204 connects to its corresponding signal bump in the second die 206 and to the corresponding signal bump in the last die 208 and so forth through a single bridge connection 224. This signal at the last die is also connected to another conductive line 226 so that the first signal path 224 connects back to a different signal bump at the first interconnect 234 at the first die 204. The result is a circular or ring signal path 224, 226. In such connection topology, the first die 204 may be a host or a master die and the other dies may be slave die modules.

The first die is over a first interconnect 234 of the bridge 222 for which four contacts are shown. The four contacts represent the start and end of two different ring paths. Both of the paths connect to all of the dies, so that the other dies each have two contacts in their respective interconnects 234, 238, one contact for each ring. As mentioned above, the first ring has an outbound electrically conductive line 224 in the bridge 222 and an inbound conductive line 226. In the same way, the second ring has an outbound electrically conductive line 228 in the bridge and an inbound conductive line 230 in the bridge. Many more rings may be used to provide additional connections, depending on the nature of the dies and the purpose of the circular or ring signal path. The bridge may also have linear paths as in FIG. 1 to support other types of communications using the same bridge.

Figure 4:
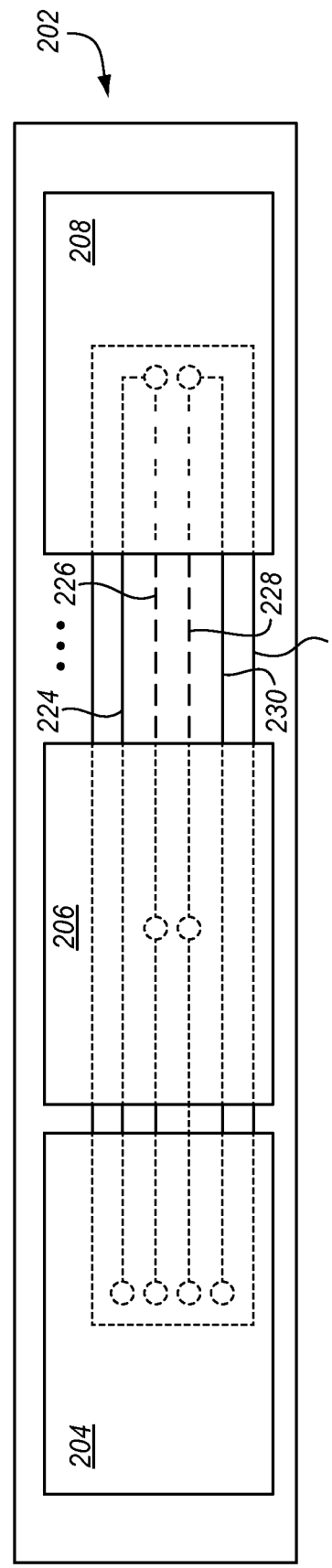
FIG. 4 is a top view diagram of the topology of FIG. 3.

FIG. 4 is a top view diagram similar to that of FIG. 2 showing the ring paths 224, 226, 228, 230 through the bridge 222.

Figure 5:
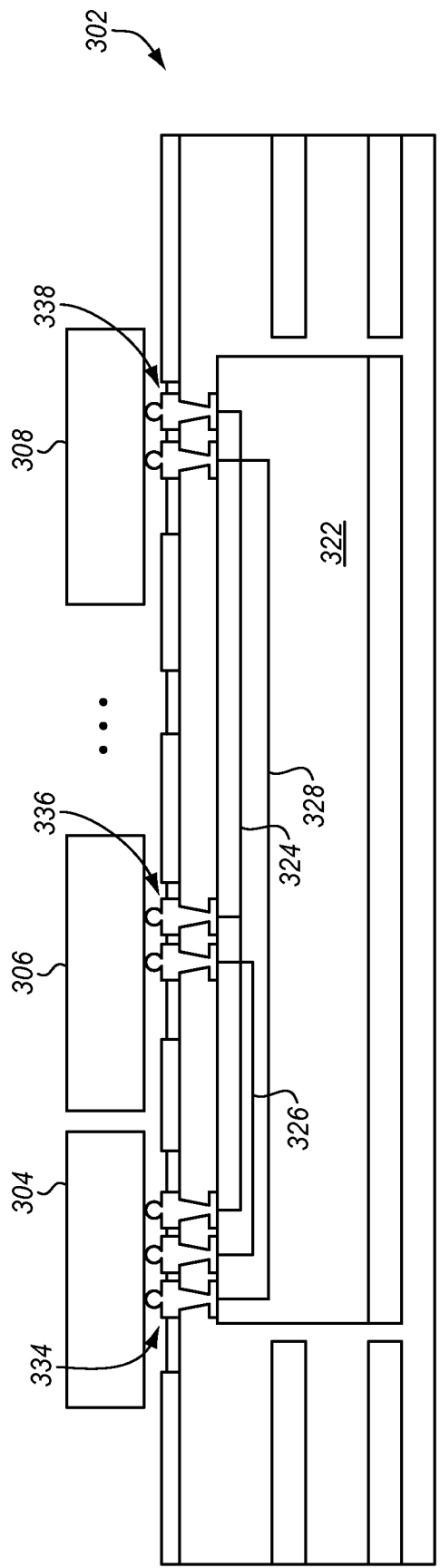
FIG. 5 is a cross-sectional side view diagram of a fly-by connection topology using an embedded silicon bridge in a package substrate according to an embodiment.

FIG. 5 is a side cross-sectional view diagram of a multi-chip module with a bridge to provide a fly-by topology. This connection topology is a combination of a point-to-point topology and a linear multi-drop topology. Some of the signals are connected in a point-to-point topology. The point-to-point signals may be data lanes between a host or master die and a slave or memory die. Others of the signals are connected in a linear multi-drop topology. These signals may be address, command, select or clock signals, for example, that need to be independently connected to each die through the bridge.

Considering the figure in more detail, the first die 304 is mounted to the substrate 302 and there is a first interconnect 334 of the bridge 322 with three different connections in this example. The first contact connects through a first line 324 in the bridge to all of the other dies 306, 308 through the respective interconnect 336, 338 for the die. This is the linear multi-drop line. As in the example of FIG. 1, one line may be used to connect to all of the dies or to particular groups of dies. A second contact of the first interconnect couples to a line 326 of the bridge that connects only to a contact of the second interconnect 336 to connect to the second die 306. This is a point-to-point contact between the first and the second die. Another contact of the first interconnect is coupled to another line 328 of the bridge that connects only to the last interconnect 338 for the last die 308. There may be additional point-to-point contacts for each die if there are more than three dies.

Figure 6:
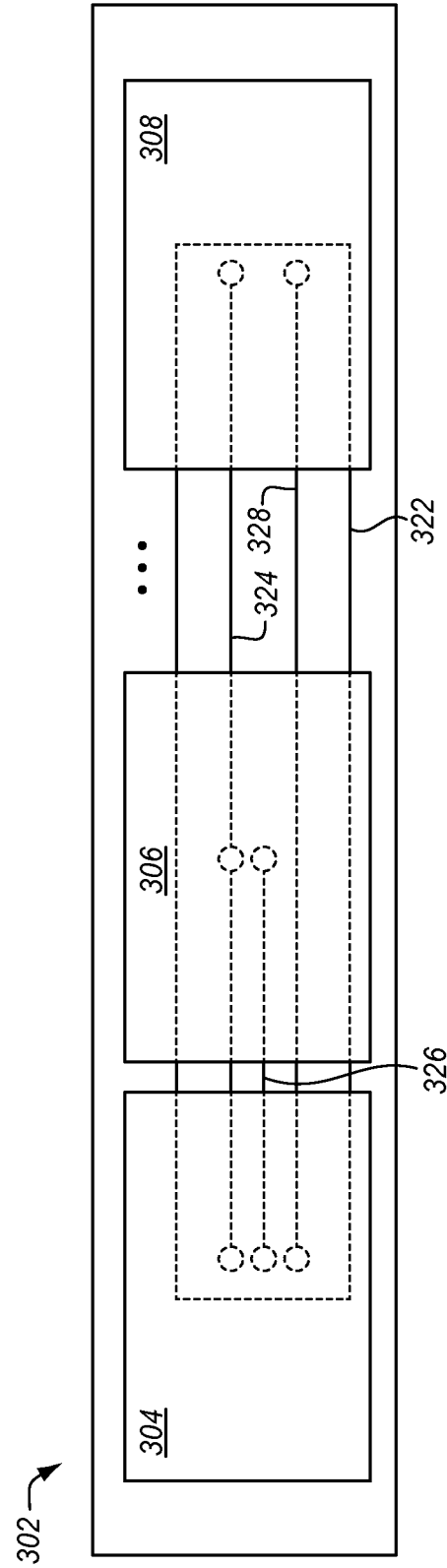
FIG. 6 is a top view diagram of the topology of FIG. 5.

FIG. 6 is a top partially transparent view diagram of the same fly-by topology. The three dies 304, 306, 308 are all attached to the substrate 302 that has an embedded bridge 322. The embedded bridge has signal lines 324, 326, 328 to support both point-to-point and linear multi-drop connections with all of the dies.

Figure 7:
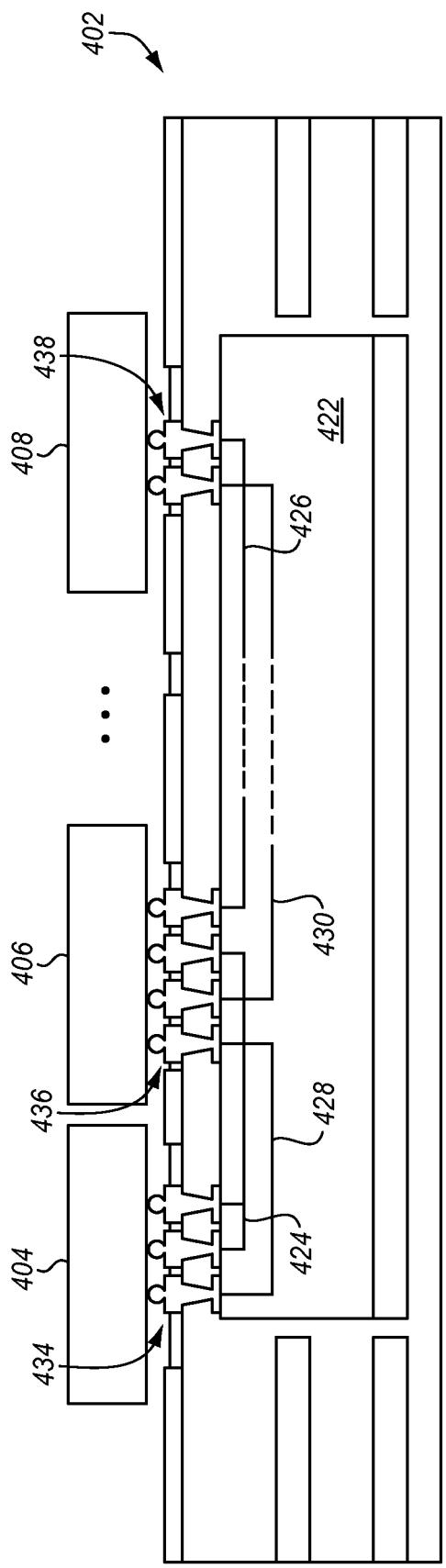
FIG. 7 is a cross-sectional side view diagram of a linear daisy-chained topology using an embedded silicon bridge in a package substrate according to an embodiment.

FIG. 7 is side cross-sectional view diagram of a substrate package with a bridge to provide a linear daisy-chained topology. In this connection topology multiple point-to-point connections are made between two dies at a time. This allows multiple dies to connect to each through a single bridge in a linear array. In such a connection topology, the first die may be a host or a master die and the other dies may again be slave die modules. In another application of such a connection topology, intermediate dies such as the second die may be a buffer die with a function to control access, buffer or convert signals, boost the signal strength, or perform any other suitable functions.

In this scenario, the interconnect 434 of the first die 404 in the chain and the interconnect 438 of the last die 408 in the chain are simpler than the interconnect 436 of the intermediate dies 406. As in the other diagrams, only three dies are shown, but there may be more dies between the second die 406 and the last die 408. Each die has a point-to-point connection with the die on either side but not to any other dies. However, this linear daisy-chain topology may be augmented by other connection topologies to support other functionalities within the package. As in the other diagrams, a logic or host die 404 may have different types of connections to different types of dies. As an example, the host die may be a general processor die and have a dedicated point-to-point connection with a co-processor die or a graphics processor die. It may also have a daisy-chain, ring, or other type of connection with a set of memory dies. These connections may all be made through the same bridge.

The second die 406 has a first and second point-to-point connection from its interconnect 436 through a first 424 and a second 426 line in the bridge 422 to the interconnect 434 of the first die 404. One connection may be an outbound connection and the other may be an inbound connection. Alternatively, if the connections are duplex connections, then each may support inbound and outbound traffic. The two lines double the data rate or provide different dedicated functions. Similarly, the second die has a first 426 and second 430 point-to-point connection from its interconnect 436 to the interconnect 438 of the next die 408 on the side of the second die opposite the first die. In this diagram only three dies are shown, so that the last interconnect 438 of the last die 408 is the last interconnect of the last die, however, if there are other dies in between the second and the last die, then one of these will be connected to the second die instead of the last die.

Figure 8:
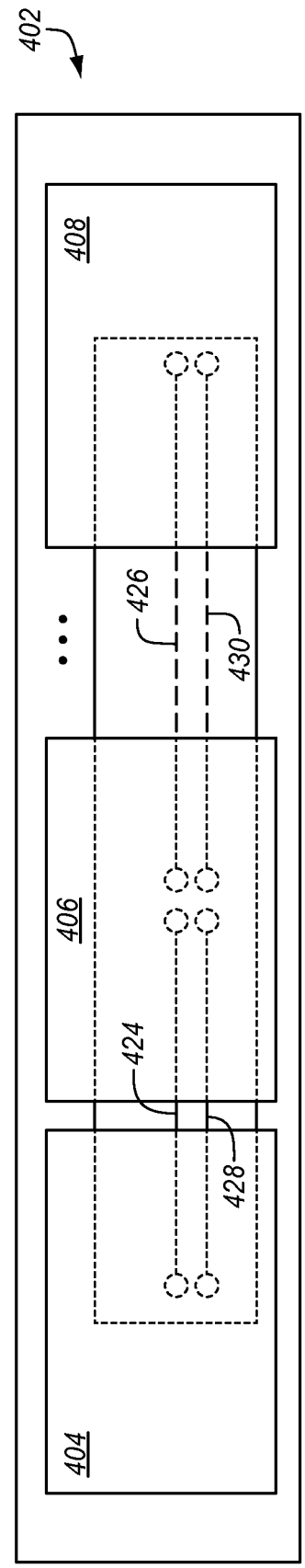
FIG. 8 is a top view diagram of the topology of FIG. 7.

FIG. 8 is a top partially transparent view of the connection topology of FIG. 7 showing the two lines 424, 428 with the first die and the two lines 426, 430 with the last die 408.

Figure 9:
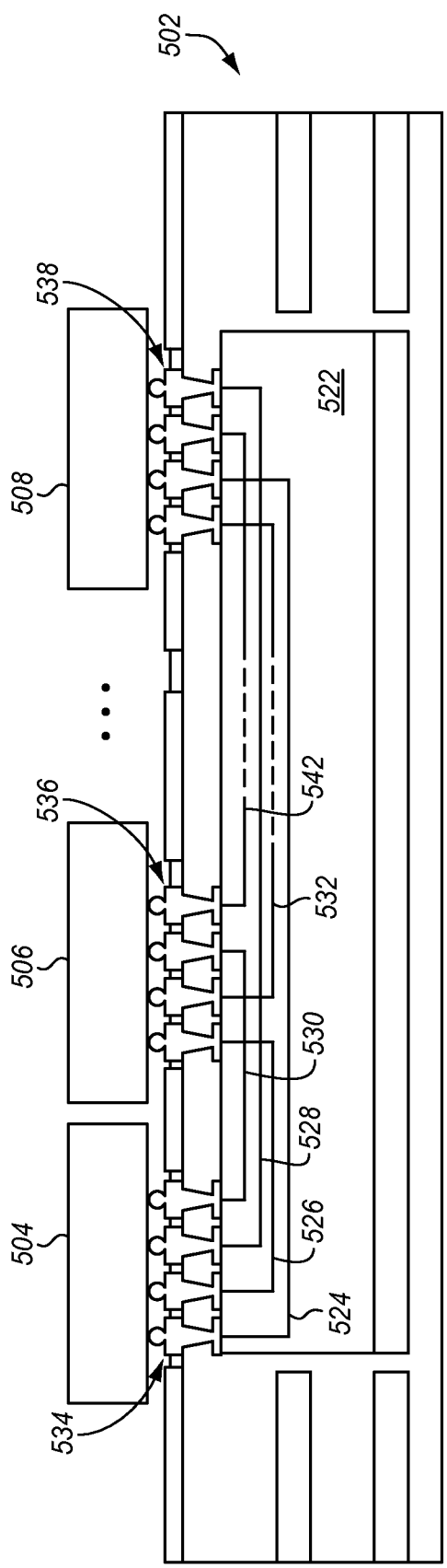
FIG. 9 is a cross-sectional side view diagram of a ring daisy-chained topology using an embedded silicon bridge in a package substrate according to an embodiment.

FIG. 9 is side cross-sectional view of a ring daisy-chained topology. In this connection topology, multiple point-to-point connection topologies between two dies can be implemented to connect multiple dies through a single bridge that makes a circular signal path to another signal bump of the first die. This topology is the same as that of FIG. 7 except that a return path 528 is added from the last die back to the first die. As in some of the other examples, in such a connection topology, the first die may be a host or a master die and the other dies may be slave die modules.

In this example, with only three dies shown, there is a path from each die to each other die. More paths may be used to serve additional data, provide inbound and outbound data and for other purposes, including to add a shared control bus. The dies 504, 506, 508 are attached to the substrate 502 and are partially over an embedded bridge 522. The bridge has an interconnect 534, 536, 538 for each die as in the other diagrams. The dies are mounted over the interconnects and partially over the bridge. Part of each die is not over the bridge so that the size of the bridge is minimized.

In this topology there is an outbound path 526 and an inbound path 530 from the first die 504 to the second die 506. There is also an outbound path 524 and an inbound path 528 from the last die 508 back to the first die 504. The second die similarly has a path 526, 530 to and from the first die as well as a path 532, 542 to and from the next die. With three dies, the third die is the last die, but as with the other diagrams, there may be more dies in between the second die and the last die.

Figure 10:
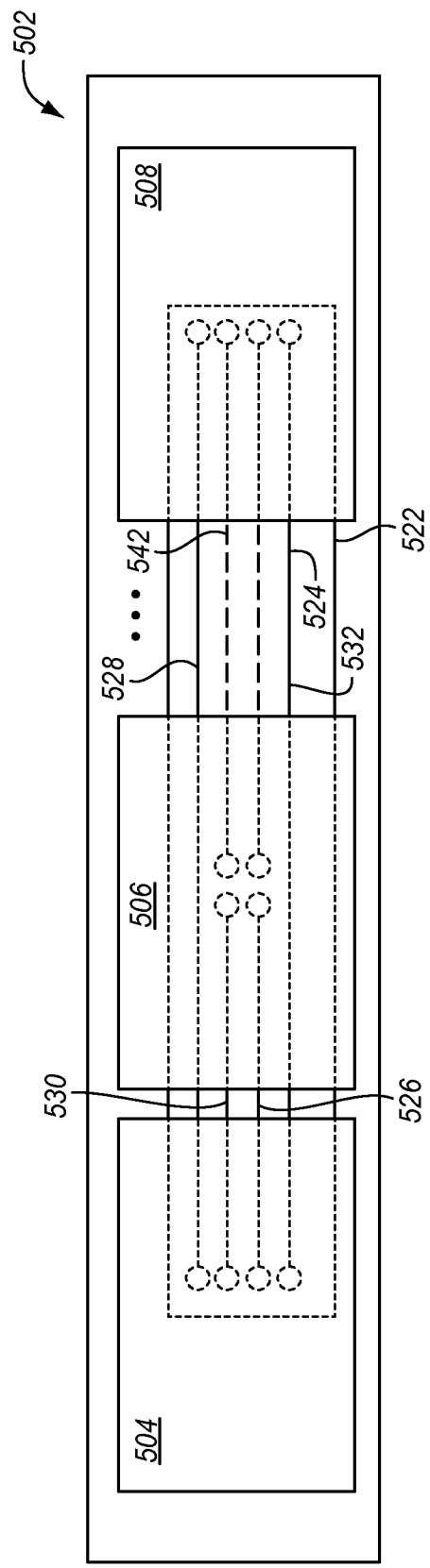
FIG. 10 is a top view diagram of the topology of FIG. 9.

FIG. 10 is top partially transparent view of the same ring daisy-chained topology showing the same paths as described above.

FIGS. 11 to 16 show various stages of fabrication for embedding a bridge into package substrate. The bridge may be made using a silicon wafer using standard silicon processing technologies. In some embodiments, the wafer is manufactured using a fabrication back-end of the line (BEOL) process. This allows the conductive lines and the contacts to be formed. The wafer is thinned and singulated and then ready to be embedded into a package substrate.

Figure 11:
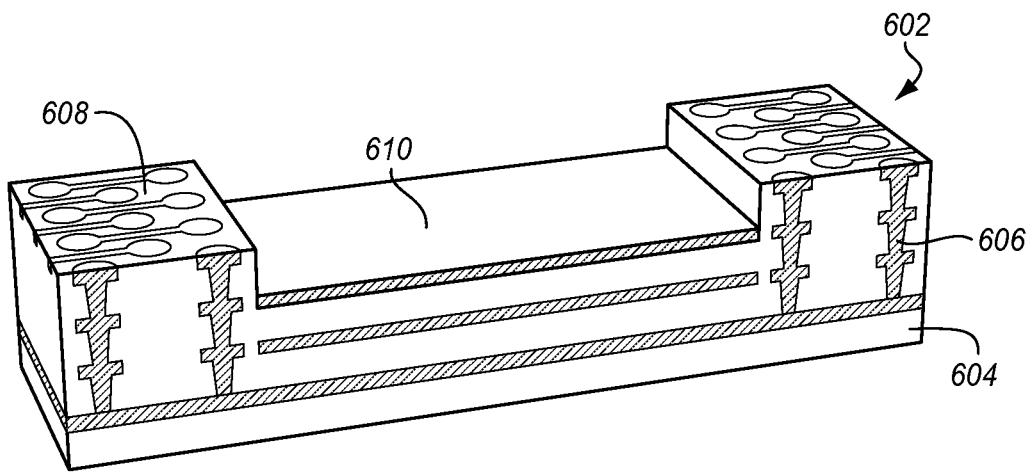
FIGS. 11-16 are cross-sectional side view of stages of fabrication of an embedded bridge in a package substrate.

An isometric and cross-sectional view of a package substrate is shown in FIG. 11. The package substrate 602 may be made in any of a variety of different ways, depending on the implementation. A traditional organic package substrate has a build-up process with layers of dielectric 604 alternating with patterned metal 606 until the final build-up layer 608. Vias connect the metal layers together as desired. After the final layer, one or more cavities 510 are created to accommodate one or more bridges.

Figure 12:
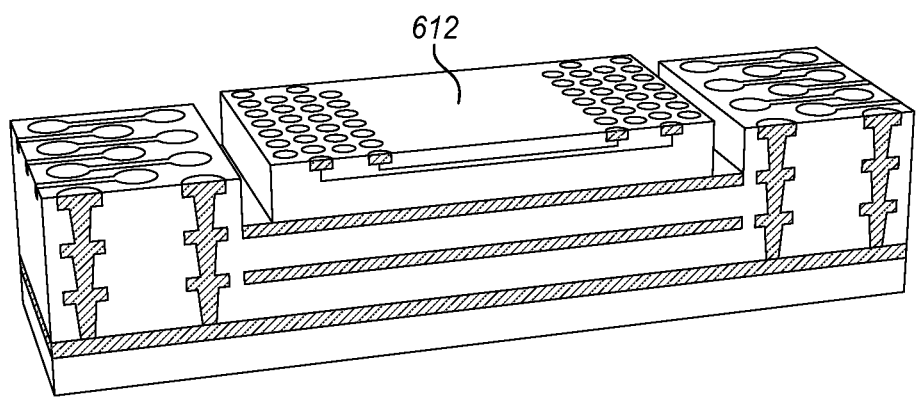

In FIG. 12, an adhesive is applied to the bridge and the bridge 612 is placed in the cavity. The bridge is held in place with the adhesive.

Figure 13:
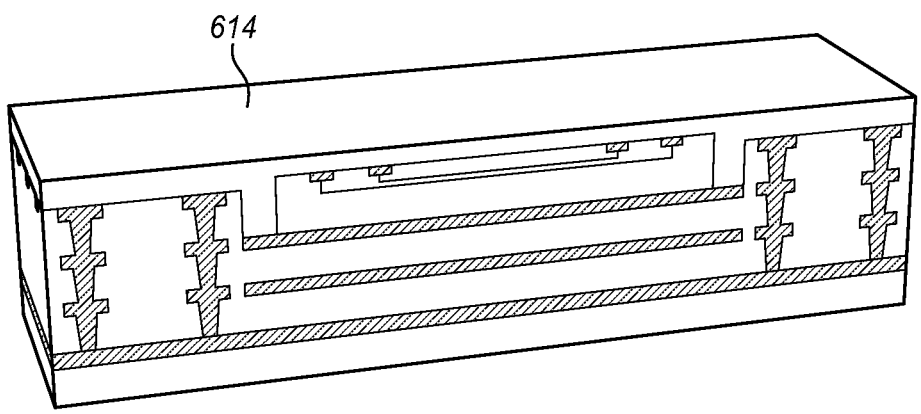

In FIG. 13, additional layers of buildup dielectrics 614 are applied over the bridge. This electrically isolates the bridge and provides a flat surface upon which the dies may be mounted. The top of the package substrate may be planarized by mechanical polishing or in another way to further ensure a reliable connection to the dies.

Figure 14:
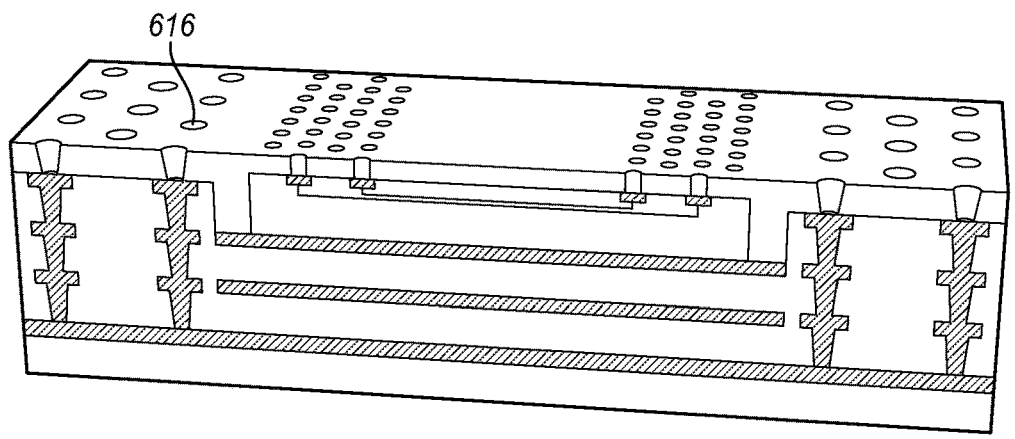

In FIG. 14 fine vias 616 are formed through the top dielectric 614 to make a connection to pads or lands on the bridge 612. Additional coarse vias may be formed elsewhere and in the package substrate 602 if not formed already.

Figure 15:
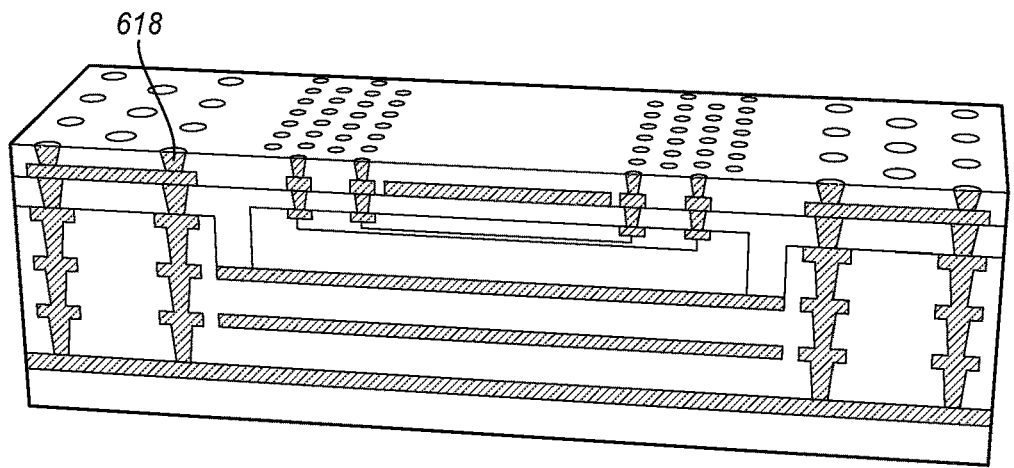

In FIG. 15, the contacts 618 are formed over the vias to create the interconnects that connect to the dies.

Figure 16:
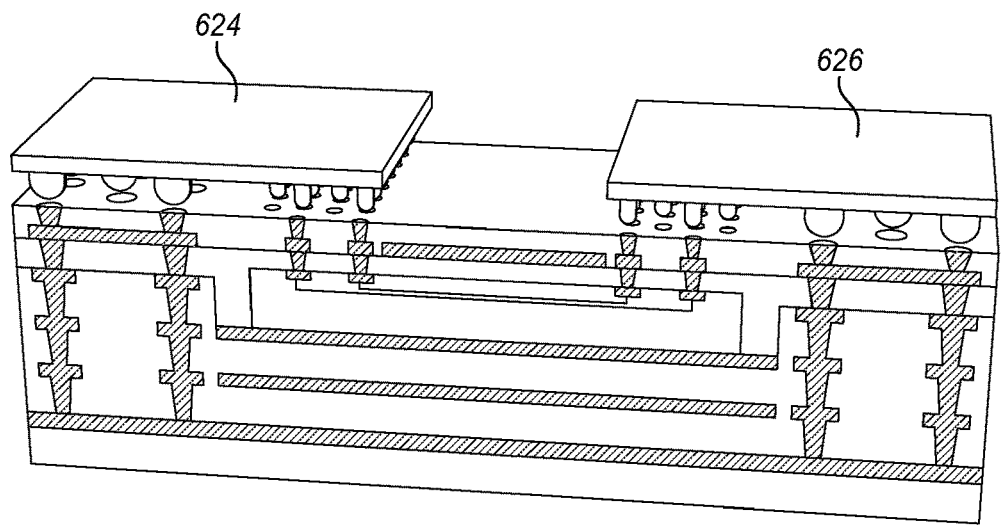

In FIG. 16, the dies or chips 624, 626 are attached over the substrate and over the interconnects of the bridge. With the bridge being embedded and the vias to the bridge being vias through standard build up layers, the chip attach process may be the same as for other package substrates. Any number of additional finishing steps may be performed including capillary underfill. While the illustrated example shows only two dies, there may be more as shown in the other drawing figures.

Figure 17:
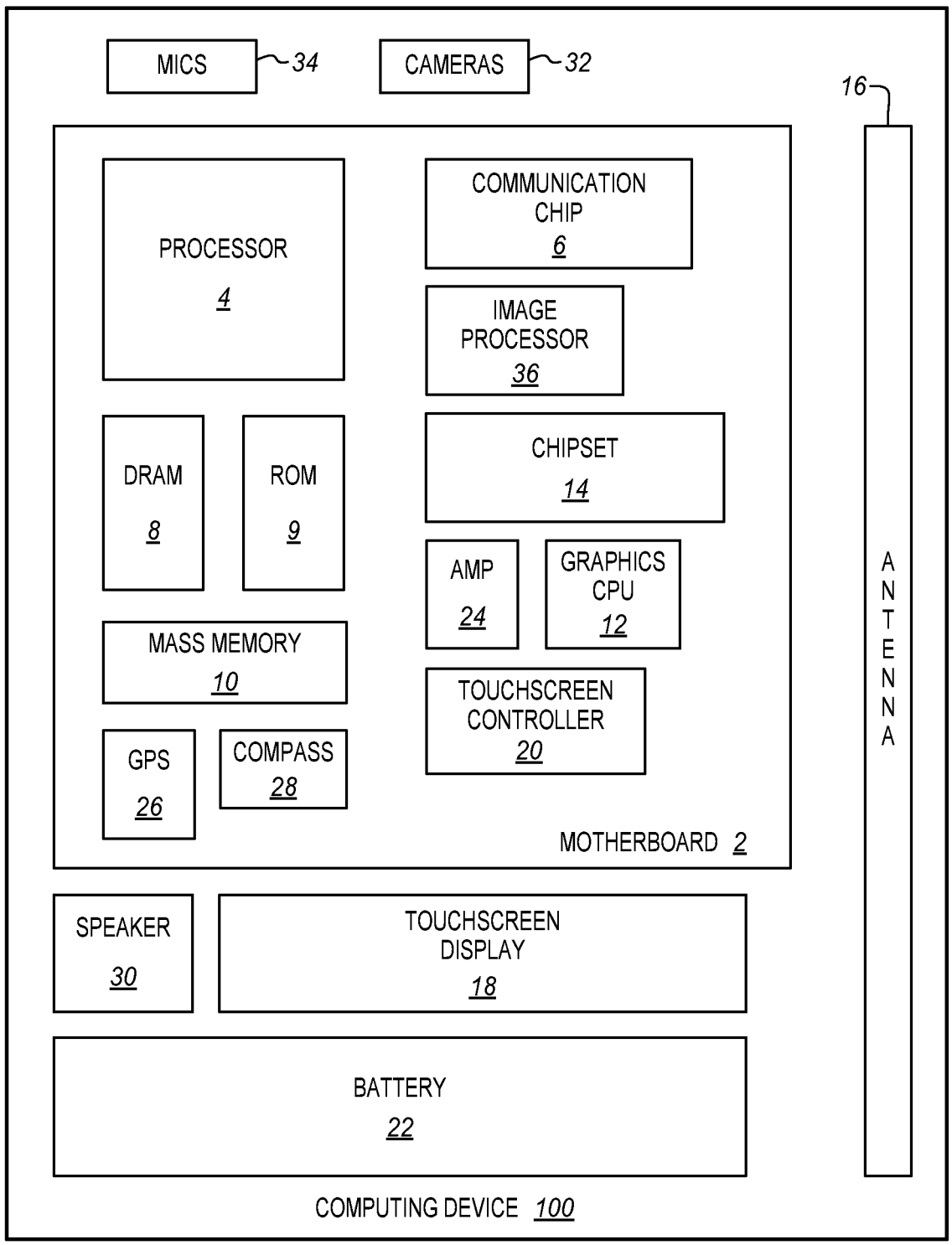
FIG. 17 is a block diagram of a computing device incorporating a multi-chip module with an embedded multi-die interconnect bridge according to an embodiment.

FIG. 17 is a block diagram of a computing device 100 in accordance with one implementation. The computing device 100 houses a system board 2. The board 2 may include a number of components, including but not limited to a processor 4 and at least one communication package 6. The communication package is coupled to one or more antennas 16. The processor 4 is physically and electrically coupled to the board 2.

Depending on its applications, computing device 100 may include other components that may or may not be physically and electrically coupled to the board 2. These other components include, but are not limited to, volatile memory (e.g., DRAM) 8, non-volatile memory (e.g., ROM) 9, flash memory (not shown), a graphics processor 12, a digital signal processor (not shown), a crypto processor (not shown), a chipset 14, an antenna 16, a display 18 such as a touchscreen display, a touchscreen controller 20, a battery 22, an audio codec (not shown), a video codec (not shown), a power amplifier 24, a global positioning system (GPS) device 26, a compass 28, an accelerometer (not shown), a gyroscope (not shown), a speaker 30, cameras 32, a microphone array 34, and a mass storage device (such as hard disk drive) 10, compact disk (CD) (not shown), digital versatile disk (DVD) (not shown), and so forth). These components may be connected to the system board 2, mounted to the system board, or combined with any of the other components.

The communication package 6 enables wireless and/or wired communications for the transfer of data to and from the computing device 100. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication package 6 may implement any of a number of wireless or wired standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, Ethernet derivatives thereof, as well as any other wireless and wired protocols that are designated as 3G, 4G, 5G, and beyond. The computing device 100 may include a plurality of communication packages 6. For instance, a first communication package 6 may be dedicated to shorter range wireless communications such as Wi-Fi and Bluetooth and a second communication package 6 may be dedicated to longer range wireless communications such as GPS, EDGE, GPRS, CDMA, WiMAX, LTE, Ev-DO, and others.

The multi-die interconnect may be used to package any one or more of the illustrated components. For example, the DRAM, ROM, image processor, graphics processor, mass memory, communications, or sensors may be packaged together with any other one of the components, including the processor. Multiple processors may be packaged together and communicate efficiently using any of the described topologies. While many of the examples are directed to a processor coupled as a master to a processor, other components may be connected in other ways. The bridge may be used to connect components as peer-to-peer.

In various implementations, the computing device 100 may be a laptop, a netbook, a notebook, an ultrabook, a smartphone, a tablet, a personal digital assistant (PDA), an ultra mobile PC, a mobile phone, a desktop computer, a server, a set-top box, an entertainment control unit, a digital camera, a portable music player, or a digital video recorder. The computing device may be fixed, portable, or wearable. In further implementations, the computing device 100 may be any other electronic device that processes data or records data for processing elsewhere.

Embodiments may be implemented using one or more memory chips, controllers, CPUs (Central Processing Unit), microchips or integrated circuits interconnected using a motherboard, an application specific integrated circuit (ASIC), and/or a field programmable gate array (FPGA).

References to "one embodiment", "an embodiment", "example embodiment", "various embodiments", etc., indicate that the embodiment(s) so described may include particular features, structures, or characteristics, but not every embodiment necessarily includes the particular features, structures, or characteristics. Further, some embodiments may have some, all, or none of the features described for other embodiments.

In the following description and claims, the term "coupled" along with its derivatives, may be used. "Coupled" is used to indicate that two or more elements co-operate or interact with each other, but they may or may not have intervening physical or electrical components between them.

As used in the claims, unless otherwise specified, the use of the ordinal adjectives "first", "second", "third", etc., to describe a common element, merely indicate that different instances of like elements are being referred to, and are not intended to imply that the elements so described must be in a given sequence, either temporally, spatially, in ranking, or in any other manner.

The drawings and the forgoing description give examples of embodiments. Those skilled in the art will appreciate that one or more of the described elements may well be combined into a single functional element. Alternatively, certain elements may be split into multiple functional elements. Elements from one embodiment may be added to another embodiment. For example, orders of processes described herein may be changed and are not limited to the manner described herein. Moreover, the actions of any flow diagram need not be implemented in the order shown; nor do all of the acts necessarily need to be performed. Also, those acts that are not dependent on other acts may be performed in parallel with the other acts. The scope of embodiments is by no means limited by these specific examples. Numerous variations, whether explicitly given in the specification or not, such as differences in structure, dimension, and use of material, are possible. The scope of embodiments is at least as broad as given by the following claims.

The following examples pertain to further embodiments. The various features of the different embodiments may be variously combined with some features included and others excluded to suit a variety of different applications. Some embodiments pertain to a microelectronic package that includes a package substrate, a silicon bridge embedded in the substrate, a first interconnect having a first plurality of contacts at a first location of the silicon bridge, a second interconnect having a second plurality of contacts at a second location of the silicon bridge, a third interconnect having a third plurality of contacts at a third location of the silicon bridge, and an electrically conductive line in the silicon bridge connecting a contact of the first interconnect, a contact of the second interconnect, and a contact of the third interconnect each to each other.

In some embodiments the substrate contains a well having a buffer material therein and the silicon bridge is embedded in the well adjacent to the buffer material.

Further embodiments include a dielectric over the silicon bridge and a plurality of copper pillars each over one of the first plurality of contacts.

In some embodiments the copper pillars each comprise an interlocking feature to connect to a bump of a die over the first interconnect.

In some embodiments a width of the electrically conductive line is no greater than approximately 0.2 microns.

In some embodiments the package substrate is formed of an organic material and metal layers.

In some embodiments the silicon bridge is embedded within the top five metal layers and wherein the first two metal layers are covered with a dielectric.

In some embodiments the bridge is narrower than a die attached to the second interconnect and shorter than a die attached to the first interconnect so that the area of the bridge under the first and second die is less than the area of the first and second die on the package substrate.

In some embodiments the electrically conductive line comprises a first line between the first die and the second die and a second line between the second die and the third die for a daisy-chained connection between the first die, the second die, and the third die.

Further embodiments include a second electrically conductive line in the silicon bridge connecting a second contact of the first interconnect to a second contact of the third interconnect form a daisy-chain connection topology.

Further embodiments include a second electrically conductive line in the silicon bridge connecting a second contact of the first interconnect to a second contact of the second interconnect and a second contact of the third interconnect to form a ring connection topology.

Further embodiments include a second line between the first die and the second die, a third line between the first die and the third die, and a fourth line between the second die and the third die for a fly-by connection between the first die, the second die, and the third die.

Further embodiments include a fifth line to connect to each of the interconnect areas for a control bus to each of the dies.

In some embodiments the first interconnect is to couple to a host die and the second and third interconnects are to connect to slave dies.

Some embodiments pertain to a method of manufacturing a microelectronic package that includes forming a well in organic layers of a package substrate, placing a silicon bridge into the well, the bridge having a first interconnect having a first plurality of contacts at a first location of the silicon bridge, a second interconnect having a second plurality of contacts at a second location of the silicon bridge, a third interconnect having a third plurality of contacts at a third location of the silicon bridge, and an electrically conductive line in the silicon bridge connecting a contact of the first interconnect, a contact of the second interconnect, and a contact of the third interconnect each to each other, covering the silicon bridge with a dielectric, forming vias through the dielectric to the first, second, and third interconnects, attaching a first die over the first interconnect to connect to the first interconnect through the respective via, attaching a second die over the second interconnect to connect to the second interconnect through the respective via, and attaching a third die over the third interconnect to connect to the third interconnect through the respective via.

Further embodiments include applying an adhesive in the well before placing the silicon bridge.

In some embodiments attaching the first die comprises attaching the first die over the dielectric covering the silicon bridge.

Some embodiments pertain to a computing system that includes a circuit board, a mass memory attached to the circuit board, and a multi-chip package attached to the circuit board and coupled to the mass memory through the circuit board, the package including a package substrate, a silicon bridge embedded in the substrate, a first interconnect coupled to a processor having a first plurality of contacts at a first location of the silicon bridge, a second interconnect coupled to a memory having a second plurality of contacts at a second location of the silicon bridge, a third interconnect coupled to a memory having a third plurality of contacts at a third location of the silicon bridge, and an electrically conductive line in the silicon bridge connecting a contact of the first interconnect, a contact of the second interconnect, and a contact of the third interconnect each to each other.

In some embodiments the processor acts as a master to the memories that are coupled to the host through the silicon bridge.

Further embodiments include a second electrically conductive line in the silicon bridge connecting a second contact of the first interconnect to a second contact of the second interconnect and a second contact of the third interconnect to form a ring connection topology.

The invention claimed is:

1. A microelectronic package comprising:
   a package substrate;
   a silicon bridge embedded in the substrate;
   a first interconnect having a first plurality of contacts at a first location of the silicon bridge, the first interconnect for coupling to a first die;
   a second interconnect having a second plurality of contacts at a second location of the silicon bridge, the second interconnect for coupling to a second die;
   a third interconnect having a third plurality of contacts at a third location of the silicon bridge, the third interconnect for coupling to a third die, wherein the first plurality of contacts, the second plurality of contacts and the third plurality of contacts are in a same plane; and
   an electrically conductive line in the silicon bridge laterally connecting a contact of the first interconnect, a contact of the second interconnect, and a contact of the third interconnect each to each other.

2. The package of claim 1, wherein:
   the substrate contains a well having a buffer material therein; and
   the silicon bridge is embedded in the well adjacent to the buffer material.

3. The package of claim 2, further comprising a dielectric over the silicon bridge and a plurality of copper pillars each over one of the first plurality of contacts.

4. The package of claim 3, wherein the copper pillars each comprise an interlocking feature to connect to a bump of a die over the first interconnect.

5. The package of claim 1, wherein a width of the electrically conductive line is no greater than approximately 0.2 microns.

6. The package of claim 1, wherein the package substrate is formed of an organic material and metal layers.

7. The package of claim 1, wherein the silicon bridge is embedded within the top five metal layers and wherein the first two metal layers are covered with a dielectric.

8. The package of claim 1, wherein the bridge is narrower than the second die attached to the second interconnect and shorter than the first die attached to the first interconnect so that the area of the bridge under the first die and the second die is less than the area of the first die and the second die on the package substrate.

9. A method of manufacturing a microelectronic package comprising:
   forming a well in organic layers of a package substrate;
   placing a silicon bridge into the well, the bridge having a first interconnect having a first plurality of contacts at a first location of the silicon bridge, a second interconnect having a second plurality of contacts at a second location of the silicon bridge, a third interconnect having a third plurality of contacts at a third location of the silicon bridge, and an electrically conductive line in the silicon bridge laterally connecting a contact of the first interconnect, a contact of the second interconnect, and a contact of the third interconnect each to each other;
   covering the silicon bridge with a dielectric;
   forming vias through the dielectric to the first, second, and third interconnects;
   attaching a first die over the first interconnect to connect to the first interconnect through the respective via;
   attaching a second die over the second interconnect to connect to the second interconnect through the respective via; and
   attaching a third die over the third interconnect to connect to the third interconnect through the respective via.

10. The method of claim 9, further comprising applying an adhesive in the well before placing the silicon bridge.

11. The method of claim 9, wherein attaching the first die comprises attaching the first die over the dielectric covering the silicon bridge.

12. A computing system comprising:
   a circuit board;
   a mass memory attached to the circuit board; and
   a multi-chip package attached to the circuit board and coupled to the mass memory through the circuit board, the package including a package substrate, a silicon bridge embedded in the substrate, a first interconnect coupled to a processor having a first plurality of contacts at a first location of the silicon bridge, a second interconnect coupled to a memory having a second plurality of contacts at a second location of the silicon bridge, a third interconnect coupled to a memory having a third plurality of contacts at a third location of the silicon bridge, and an electrically conductive line in the silicon bridge laterally connecting a contact of the first interconnect, a contact of the second interconnect, and a contact of the third interconnect each to each other.

13. The computing system of claim 12, wherein the processor acts as a master to the memories that are coupled to the host through the silicon bridge.

14. The computing system of claim 13, further comprising a second electrically conductive line in the silicon bridge connecting a second contact of the first interconnect to a second contact of the second interconnect and a second contact of the third interconnect to form a ring connection topology.

15. A microelectronic package comprising:
   a package substrate;
   a silicon bridge embedded in the substrate, wherein the substrate contains a well having a buffer material therein, and the silicon bridge is embedded in the well adjacent to the buffer material;
   a first interconnect having a first plurality of contacts at a first location of the silicon bridge;
   a second interconnect having a second plurality of contacts at a second location of the silicon bridge;
   a third interconnect having a third plurality of contacts at a third location of the silicon bridge; and
   an electrically conductive line in the silicon bridge connecting a contact of the first interconnect, a contact of the second interconnect, and a contact of the third interconnect each to each other.

* * * * *